United States Patent
Habu et al.

(10) Patent No.: US 8,388,786 B2
(45) Date of Patent: Mar. 5, 2013

(54) SUBSTRATE-LESS PRESSURE-SENSITIVE ADHESIVE SHEET FOR PROTECTION OF SEMICONDUCTOR WAFER, METHOD FOR GRINDING BACK SIDE OF SEMICONDUCTOR WAFER USING PRESSURE-SENSITIVE ADHESIVE SHEET, AND METHOD FOR PRODUCING PRESSURE-SENSITIVE ADHESIVE SHEET

(75) Inventors: Takashi Habu, Ibaraki (JP); Fumiteru Asai, Ibaraki (JP); Tomokazu Takahashi, Ibaraki (JP); Akinori Nishio, Ibaraki (JP); Toshio Shintani, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 443 days.

(21) Appl. No.: 12/720,704

(22) Filed: Mar. 10, 2010

(65) Prior Publication Data
US 2010/0230036 A1    Sep. 16, 2010

(30) Foreign Application Priority Data
Mar. 11, 2009    (JP) .................................. 2009-057644

(51) Int. Cl.
*B32B 37/00* (2006.01)
(52) U.S. Cl. ........ 156/154; 156/153; 156/247; 156/249; 156/272.2; 156/325
(58) Field of Classification Search .................. 156/153, 156/154, 272.2, 247, 249, 325
See application file for complete search history.

(56) References Cited

U.S. PATENT DOCUMENTS

| | | | | |
|---|---|---|---|---|
| 4,181,752 A | * | 1/1980 | Martens et al. | 427/516 |
| 4,656,077 A | * | 4/1987 | Larimore et al. | 428/156 |
| 5,525,422 A | * | 6/1996 | Spies et al. | 428/355 AC |
| 5,670,260 A | * | 9/1997 | Zajaczkowski et al. | 428/345 |
| 6,524,701 B1 | * | 2/2003 | Kondo et al. | 428/355 RA |

FOREIGN PATENT DOCUMENTS

| | | |
|---|---|---|
| JP | 2000-150432 A | 5/2000 |
| JP | 200-212524 A | 8/2000 |

\* cited by examiner

*Primary Examiner* — Jeff Aftergut
(74) *Attorney, Agent, or Firm* — Sughrue Mion, PLLC

(57) ABSTRACT

The present invention provides a substrate-less pressure-sensitive adhesive sheet for protection of semiconductor wafer, which is to be stuck to a front surface of a semiconductor wafer in grinding a back surface of the semiconductor wafer, the pressure-sensitive adhesive sheet consisting of a pressure-sensitive adhesive layer, in which the pressure-sensitive adhesive layer is formed of a UV-curable pressure-sensitive adhesive containing a polymer composed mainly of an acrylic monomer polymerizable compound, the pressure-sensitive adhesive force of a surface of the pressure-sensitive adhesive layer to be stuck to the front surface of the semiconductor wafer is larger than the pressure-sensitive adhesive force of the opposite surface thereof, and the pressure-sensitive adhesive layer has an initial elastic modulus of from 0.01 MPa to 500 MPa.

1 Claim, No Drawings

SUBSTRATE-LESS PRESSURE-SENSITIVE ADHESIVE SHEET FOR PROTECTION OF SEMICONDUCTOR WAFER, METHOD FOR GRINDING BACK SIDE OF SEMICONDUCTOR WAFER USING PRESSURE-SENSITIVE ADHESIVE SHEET, AND METHOD FOR PRODUCING PRESSURE-SENSITIVE ADHESIVE SHEET

FIELD OF THE INVENTION

The present invention relates to a substrate-less pressure-sensitive adhesive sheet for protecting a semiconductor wafer with which little warpage of the semiconductor wafer is generated even after grinding the semiconductor wafer to a ultrathin level or after grinding a large-diameter wafer, to a method for grinding the back surface of a semiconductor wafer using the pressure-sensitive adhesive sheet, and to a method for producing the pressure-sensitive adhesive sheet.

BACKGROUND OF THE INVENTION

Recently, with the tendency toward down-sizing of various electronic devices and with the popularization of IC cards, electronic parts such as semiconductor wafers and others are desired to be thinned further more. Accordingly, semiconductor wafers heretofore having a thickness of around 350 µm are needed to be thinned more to have a thickness of at most around 50 µm or so. For enhancement of producibility, further increasing the diameter of semiconductor wafers is now under investigation.

In general, in production of semiconductor wafers, a circuit pattern is formed on the front surface of a wafer, and then the back surface of the wafer is ground with a grinder or the like so as to have a predetermined thickness. In this stage, for the purpose of protecting the front surface of the wafer, in general, the back surface of the wafer is ground while a pressure-sensitive adhesive sheet is stuck to the front surface of the wafer. Further, after the wafer is processed to be thin, the wafer may be transferred to the next step while a pressure-sensitive adhesive sheet is kept stuck to the front surface of the wafer.

However, in case where the back surface of the wafer is ground to an ultrathin level while the front surface of the wafer is protected with a pressure-sensitive adhesive sheet, the ground wafer may be often warped. The warped wafer has a problem in that it may be often cracked during transportation thereof or in peeling the pressure-sensitive adhesive sheet therefrom. In particular, in grinding large-size wafers having a diameter of 8 inches or 12 inches that are often used in the art or in grinding thin wafers for IC cards or the like, the problem of warpage is serious.

It is considered that the warpage of wafers after grinding may be greatly influenced by the residual stress remaining in the pressure-sensitive adhesive sheet stuck to wafers. When a wafer with a pressure-sensitive adhesive sheet stuck thereto is ground ultrathinly, it is considered that the residual stress may be higher than the strength of the wafer and the wafer may be warped due to the force to remove the residual stress. Accordingly, for reducing the residual stress, the constitution of the pressure-sensitive adhesive sheet has been modified or improved variously, and a constitution not yielding a residual stress has been proposed. For example, Patent Reference 1 proposes a pressure-sensitive adhesive sheet for protection of semiconductor wafer, which includes a substrate film and a pressure-sensitive adhesive layer and in which the modulus of tensile elasticity of the substrate film is 0.6 GPa.

Patent Reference 2 proposes a pressure-sensitive adhesive sheet for processing semiconductor wafer, which includes a substrate and a pressure-sensitive adhesive layer formed on the substrate, and in which the stress-relaxation rate of the pressure-sensitive adhesive sheet after 1 minute at an elongation of 10% in the tensile test thereof is at least 40%.

However, the properties of these pressure-sensitive adhesive sheets are not always the best for preventing ground wafers from being warped in ultrathinly grinding semiconductor wafers or in grinding large-diameter wafers. Accordingly, it has been desired to provide a pressure-sensitive adhesive sheet for protection of semiconductor wafer which can more effectively prevent ground wafers from being warped.

With the recent tendency toward ultrathinly grinding wafers in the art, it has been also desired to prevent wafers from being cracked by the stress in grinding them and to prevent the edges of wafers from being broken off.

Further with the recent tendency toward high-density, down-sized, high-function semiconductor packages, chip stacking technology is promoted, in which the thickness fluctuation between ultrathinned wafer chips is considered problematic. The thickness fluctuation between chips is because the thickness fluctuation in the pressure-sensitive adhesive sheet to protect patterns in wafer grinding is directly transferred as such to the ground chips, and therefore the accuracy of the thickness of the pressure-sensitive adhesive sheet has been an important issue in the art.

Patent Reference 1: JP-A-2000-212524
Patent Reference 2: JP-A-2000-150432

SUMMARY OF THE INVENTION

An object of the invention is to provide a substrate-less pressure-sensitive adhesive sheet for protection of semiconductor wafer which, even when used in ultrathinly grinding a semiconductor wafer or when used in grinding a large-diameter semiconductor wafer, can well protect the semiconductor wafer so as not to be warped, and which is excellent in stress dispersibility in grinding, which can prevent a semiconductor wafer from being cracked or from being broken at the edges thereof, and which ensures high accuracy of wafer thickness after grinding; and to provide a method for grinding the back surface of a semiconductor wafer using the pressure-sensitive adhesive sheet and a method for producing the pressure-sensitive adhesive sheet.

Namely, the present invention provides a substrate-less pressure-sensitive adhesive sheet for protection of semiconductor wafer, which is to be stuck to a front surface of a semiconductor wafer in grinding a back surface of the semiconductor wafer, the pressure-sensitive adhesive sheet consisting of a pressure-sensitive adhesive layer, in which the pressure-sensitive adhesive layer is formed of a UV-curable pressure-sensitive adhesive containing a polymer composed mainly of an acrylic monomer polymerizable compound, the pressure-sensitive adhesive force of a surface of the pressure-sensitive adhesive layer to be stuck to the front surface of the semiconductor wafer is larger than the pressure-sensitive adhesive force of the opposite surface thereof, and the pressure-sensitive adhesive layer has an initial elastic modulus of from 0.01 MPa to 500 MPa.

In general, the pressure-sensitive adhesive sheet to be stuck to the front surface of a semiconductor wafer is constituted by a substrate and a pressure-sensitive adhesive layer. When the pressure-sensitive adhesive sheet of this type is stuck to the front surface of a wafer, a sticking machine is used. Briefly, a wafer is put on a sticking table with the front surface of the wafer kept facing up, then a pressure-sensitive adhesive sheet is supplied onto it with the pressure-sensitive adhesive layer of the pressure-sensitive adhesive sheet kept facing down while the pressure-sensitive adhesive sheet is kept pulled along the sticking direction so as not to be loosened. In that manner, the pressure-sensitive adhesive layer of the pressure-sensitive adhesive sheet is kept facing the front surface of the wafer, and the two are stuck to each other under pressure from the substrate side of the pressure-sensitive adhesive sheet in the sticking direction, by a pressure means such as a press roll or the like. In this stage, a force to pull the pressure-sensitive adhesive sheet along the sticking direction thereof and a force to press the pressure-sensitive adhesive sheet against the wafer are given to the pressure-sensitive adhesive sheet, and therefore after the pressure-sensitive adhesive sheet is stuck to the wafer, these forces remain in the pressure-sensitive adhesive sheet as residual stress therein. When the back surface of the wafer to which a pressure-sensitive adhesive sheet is stuck is ground and when the residual stress in the pressure-sensitive adhesive sheet is higher than the strength of the wafer, then it is considered that the wafer may be warped due to the force to remove the residual stress. In general, when a substrate is compared with a pressure-sensitive adhesive, the initial elastic modulus of the substrate is higher than that of the pressure-sensitive adhesive, and therefore the residual stress is caused by the substrate. In case where a substrate-less pressure-sensitive adhesive sheet composed only of (consisting of) a pressure-sensitive adhesive having a lower initial elastic modulus than that of a substrate is used, the residual stress to be generated in sticking the sheet becomes extremely small. Accordingly, when such a substrate-less pressure-sensitive adhesive sheet is used in grinding the back surface of a semiconductor wafer, then the wafer warpage after grinding can be reduced.

Preferably, the pressure-sensitive adhesive layer is formed of a UV-curable (ultraviolet-ray curable) pressure-sensitive adhesive containing a polymer composed mainly of an acrylic monomer polymerizable compound. In case where the pressure-sensitive adhesive layer is formed of an UV-curable pressure-sensitive adhesive containing a polymer composed mainly of an acrylic monomer polymerizable compound, at the time of peeling the substrate-less pressure-sensitive adhesive sheet away from the semiconductor wafer after grinding the back surface of the semiconductor wafer, the contact area of the surface of the pressure-sensitive adhesive sheet kept in contact with the surface of the semiconductor wafer reduces owing to the volume shrinkage through the curing reaction of the pressure-sensitive adhesive by irradiation of the pressure-sensitive adhesive layer with UV rays (UV irradiation), and therefore the pressure-sensitive adhesive force of the pressure-sensitive adhesive sheet can be immediately lowered. In addition, the pressure-sensitive adhesive layer is three-dimensionally crosslinked through the curing reaction, therefore having another advantage in that the adhesive residue after peeling is reduced.

The pressure-sensitive adhesive force of a surface of the pressure-sensitive adhesive layer to be stuck to the front surface of the semiconductor wafer is larger than the pressure-sensitive adhesive force of the opposite surface thereof.

In case where the pressure-sensitive adhesive force of the surface of the pressure-sensitive adhesive layer to be stuck to the front surface of the semiconductor wafer is larger than the pressure-sensitive adhesive force of the opposite surface thereof, when the separator on the opposite surface thereof is peeled away after the pressure-sensitive adhesive sheet is stuck to an adherend, there occurs no trouble of peeling the pressure-sensitive adhesive along with the separator being peeled away, since the peeling force between the separator and the pressure-sensitive adhesive layer is smaller than the peeling force between the adherend and the pressure-sensitive adhesive layer.

The initial elastic modulus of the pressure-sensitive adhesive layer is preferably from 0.01 MPa to 500 MPa, more preferably from 0.1 MPa to 100 MPa, even more preferably from 1 MPa to 50 MPa.

In case where the initial elastic modulus of the pressure-sensitive adhesive layer falls within the range, the pressure-sensitive adhesive layer may well follow the front surface of the semiconductor wafer to which it is stuck and may relieve the stress in grinding the wafer, and therefore the wafer may be prevented from being broken due to the stress in grinding. In addition, in case where the initial elastic modulus is not larger than 50 MPa, then the residual stress to be caused by deformation of the pressure-sensitive adhesive layer can be low even when the pressure-sensitive adhesive layer does not have a separator at the time of sticking the pressure-sensitive adhesive layer to a semiconductor wafer, and therefore the warpage of the semiconductor wafer after grinding the back surface thereof may be reduced.

In the substrate-less pressure-sensitive adhesive sheet of the invention, the surface of the pressure-sensitive adhesive layer opposite to the surface thereof to be stuck to the front surface of a semiconductor wafer is such that, in accordance a rolling ball tack test, a ball of No. 6 or more does not stop thereon at an inclination angle of 20°.

In case where the surface of the pressure-sensitive adhesive layer opposite to the surface thereof to be stuck to the front surface of the semiconductor wafer is such that, in a rolling ball tack test, a ball of No. 6 or more does not stop thereon at an inclination angle of 20°, then the pressure-sensitive adhesive layer is not so tacky as to stick to the robot arm in a device for grinding the back surface of the semiconductor wafer even after the separator laminated on the surface of the pressure-sensitive adhesive layer opposite to the surface thereof to be stuck to the front surface of the semiconductor wafer is peeled off, and therefore the substrate-less pressure-sensitive adhesive sheet for protection of semiconductor wafer can be transferred to the step of grinding the back surface of the semiconductor wafer without sticking to the robot arm.

In addition, in the substrate-less pressure-sensitive adhesive sheet of the invention, it is preferable that the thickness of the pressure-sensitive adhesive layer is from 5 μm to 1000 μm.

The thickness of the pressure-sensitive adhesive layer is more preferably from 10 μm to 500 μm, even more preferably from 30 μm to 250 μm. When the thickness of the pressure-sensitive adhesive layer falls within the range, then the pressure-sensitive adhesive sheet can well protect the front surface of a semiconductor wafer in grinding the back surface of the wafer. In case where the thickness of the pressure-sensitive adhesive layer is less than 5 μm, the pressure-sensitive adhesive sheet may follow even small irregularities of the front surface of a wafer and could not well protect the wafer, and if so, the wafer may be cracked while it is ground. On the other hand, when the thickness of the pressure-sensitive adhesive layer is more than 1000 μm, then it is unfavorable in point of the workability thereof in cutting the sheet after stuck to a wafer or in point of the operability thereof in a working device.

Furthermore, the present invention also provides a method for grinding a back surface of a semiconductor wafer, the method including sticking the substrate-less pressure-sensitive adhesive sheet of the invention to a front surface of the semiconductor wafer while a separator is kept laminated on the surface of the pressure-sensitive adhesive sheet opposite to the surface thereof to be stuck to the front surface of the semiconductor wafer; cutting the pressure-sensitive adhesive sheet along with the separator; peeling the separator alone; and then grinding the back surface of the semiconductor wafer.

Since the substrate-less pressure-sensitive adhesive sheet for protection of semiconductor wafer of the invention is composed only of a pressure-sensitive adhesive layer, there may be a case where it is difficult to cut the pressure-sensitive adhesive layer in a tape-sticking device due to the flexibility thereof. In this regard, the substrate-less pressure-sensitive adhesive sheet for protection of semiconductor wafer is stuck to a semiconductor wafer while a separator is kept laminated on the surface of the pressure-sensitive adhesive sheet opposite to the surface thereof to be stuck to the semiconductor wafer, and this is cut along with the separator by applying a cutting blade onto the separator, whereby the pressure-sensitive adhesive layer is prevented from being elongated during cutting and the pressure-sensitive adhesive sheet can be thereby stably cut. Finally, by peeling the separator alone, the back surface of the semiconductor wafer can be ground while only the substrate-less pressure-sensitive adhesive sheet for semiconductor wafer protection of high flexibility is kept stuck to the front surface of the semiconductor wafer, and the semiconductor wafer after ground can be thereby prevented from being warped.

Furthermore, the present invention also provides a method for producing the substrate-less pressure-sensitive adhesive sheet of the invention, the method including applying onto a separator a pressure-sensitive adhesive that contains a UV-reactive monomer (or oligomer) or a polymer having a carbon-carbon double bond in a side chain thereof, and a photopolymerization initiator, to thereby form a pressure-sensitive adhesive layer; and irradiating the pressure-sensitive adhesive layer with radiation while the coated surface thereof is kept exposed to thereby make the pressure-sensitive adhesive force of the surface of the pressure-sensitive adhesive layer facing the separator lower than the pressure-sensitive adhesive force of the opposite surface thereof.

When a semiconductor wafer is ground thinly, then the chambered wafer edges are extremely sharpened, and therefore, in case where a hard and rigid substrate is used in the pressure-sensitive adhesive sheet, then the grinding dust thereof may remain on the wafer being ground with the result that the wafer edges may be thereby broken or the stress in grinding could not be dispersed therefore causing cracking of the wafer. Accordingly, in case where a rigid substrate is used, there may be employed a method of putting a soft interlayer between the substrate and the pressure-sensitive adhesive layer, or a method of using a soft substrate in place of the rigid substrate. However, the interlayer lamination method is unfavorable as worsening the thickness accuracy of the pressure-sensitive adhesive sheet, and it is extremely difficult to produce a soft substrate with good thickness accuracy, and as a result, the thickness accuracy of the entire pressure-sensitive adhesive sheet is thereby lowered. Accordingly, it is considered that the thickness accuracy of the wafer ground with the pressure-sensitive adhesive sheet of that type stuck thereto may also be lowered. In the invention, a UV-curable pressure-sensitive adhesive is applied onto a separator with good thickness accuracy (especially PET separator or the like), and then irradiated with UV rays to produce a substrate-less pressure-sensitive adhesive sheet, and therefore, a substrate-less pressure-sensitive adhesive sheet for semiconductor wafer protection with good thickness accuracy can be provided.

DETAILED DESCRIPTION OF THE INVENTION

The substrate-less pressure-sensitive adhesive sheet for semiconductor wafer protection of the invention is composed of a pressure-sensitive adhesive layer alone. The pressure-sensitive adhesive layer may be a single layer or a multilayer.

The substrate-less pressure-sensitive adhesive sheet for semiconductor wafer protection of the invention is produced by applying a UV-curable pressure-sensitive adhesive to a separator with good thickness accuracy (especially PET separator or the like) in an ordinary manner, and then irradiated with UV rays while the coated surface is kept exposed out, thereby making only the surface of the UV-curable pressure-sensitive adhesive kept in contact with the separator non-tacky. Since the surface of the UV-curable pressure-sensitive adhesive exposed to air receives oxygen inhibition in irradiation with UV rays and is not UV-cured, its pressure-sensitive adhesive force hardly lowers. On the other hand, the surface of the UV-curable pressure-sensitive adhesive that is in contact with the separator is shielded from oxygen by the separator, and is therefore UV-cured and its pressure-sensitive adhesive force lowers. From the viewpoint of the handlability of the pressure-sensitive adhesive sheet, it is preferable that the substrate-less pressure-sensitive adhesive sheet for semiconductor wafer protection of the invention is introduced into a device for grinding the back surface of a semiconductor wafer without peeling the separator from the surface of the pressure-sensitive adhesive sheet of which the pressure-sensitive adhesive force has lowered, and the separator is peeled away just before the back surface of the semiconductor wafer is ground in the device.

The pressure-sensitive adhesive layer is controlled by suitably combining the composition of the base polymer, the type of the crosslinking agent and the blend ratio of the ingredients. For example, the initial elastic modulus of the pressure-sensitive adhesive layer may be controlled by controlling Tg and the crosslinking density of the base polymer.

As the pressure-sensitive adhesive, herein usable is any ordinary UV-curable pressure-sensitive adhesive generally used in the art. Above all, from the viewpoint of the pressure-sensitive adhesiveness to semiconductor wafers and the cleanability of the semiconductor wafers after peeled with ultrapure water or organic solvent such as alcohol, preferred is a UV-curable pressure-sensitive adhesive containing a polymer composed mainly of an acrylic monomer polymerizable compound (hereinafter this is referred to as acrylic polymer).

The acrylic polymer is, for example, an acrylic polymer of one or more monomer ingredients of alkyl (meth)acrylates (e.g., a linear or branched alkyl ester in which the alkyl group has from 1 to 30 carbon atoms, preferably from 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, eicosyl ester) and cycloalkyl (meth)acrylates (e.g., cyclopentyl ester, cyclohexyl ester). Herein, in the present specification, "(meth)acrylate" means acrylate and/or methacrylate.

If desired, the acrylic polymer may contain a unit corresponding to any other monomer (comonomer) copolymerizable with the alkyl (meth)acrylate or the cycloalkyl (meth)acrylate, for the purpose of enhancing the cohesive power and the heat resistance of the pressure-sensitive adhesive. Examples of the comonomer ingredient include a carboxyl group-containing monomer such as acrylic acid, methacrylic acid, carboxyethyl (meth)acrylate, carboxypentyl (meth)acrylate, itaconic acid, maleic acid, fumaric acid, crotonic acid, etc.; an acid anhydride monomer such as maleic anhydride, itaconic anhydride, etc.; a hydroxyl group-containing monomer such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, (4-hydroxymethylcyclohexyl)methyl (meth)acrylate, etc.; a sulfonic acid group-containing monomer such as styrenesulfonic acid, allylsulfonic acid, 2-(meth)acrylamido-2-methylpropanesulfonic acid, (meth)acrylamidopropanesulfonic acid, sulfopropyl (meth)acrylate, (meth)acryloyloxynaphthalenesulfonic acid, etc.; a phosphoric acid group-containing monomer such as 2-hydroxyethyl acryloylphosphate, etc.; acrylamide, acrylonitrile, etc. One or more such comonomer ingredients may be used either singly or as combined. The use amount of the comonomer is preferably at most 40% by weight of the entire monomer ingredients.

The acrylic polymer may optionally contain, if desired, a polyfunctional monomer as the comonomer for crosslinking. Examples of the polyfunctional monomer include hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy (meth)acrylate, polyester (meth)acrylate, urethane (meth)acrylate, etc. One or more such polyfunctional monomers may be used either singly or as combined. The use amount of the polyfunctional monomer is preferably at most 30% by weight of the entire monomer ingredients, from the viewpoint of the pressure-sensitive adhesiveness of the pressure-sensitive adhesive.

The acrylic polymer may be produced through polymerization of a single monomer or a monomer mixture of two or more monomers. The polymerization may be attained in any mode of solution polymerization, emulsion polymerization, bulk polymerization, suspension polymerization or the like. The content of a low-molecular weight substance in the pressure-sensitive adhesive layer is preferably low from the viewpoint of preventing semiconductor wafers from being contaminated with the pressure-sensitive adhesive. From this viewpoint, the weight-average molecular weight of the acrylic polymer is preferably at least about 300,000, more preferably from about 400,000 to about 3,000,000.

An external crosslinking agent may be optionally added to the pressure-sensitive adhesive for the purpose of increasing the weight-average molecular weight of the acrylic polymer as the base polymer, and the like. As a concrete means of the external crosslinking method, there may be mentioned a method of adding a so-called crosslinking agent such as a polyisocyanate compound, an epoxy compound, an aziridine compound or a melamine-type crosslinking agent to the polymer and reacting them. In case where such an external crosslinking agent is used, its amount to be used may be suitably determined in consideration of the balance between the agent and the base polymer to be crosslinked with it and depending on the use of the pressure-sensitive adhesive. In general, the amount of the crosslinking agent is preferably from about 1 part by weight to about 5 parts by weight relative to 100 parts by weight of the base polymer. Further if desired, still other additives, for example, conventionally known various tackifiers, antioxidants and the like may be added to the pressure-sensitive adhesive, in addition to the above-mentioned ingredients.

As the pressure-sensitive adhesive, a radiation-curable pressure-sensitive adhesive may also be usable in the invention. Not specifically defined, the radiation-curable pressure-sensitive adhesive may be any one that has a radiation-curable functional group such as a carbon-carbon double bond or the like and shows pressure-sensitive adhesiveness. As the radiation-curable pressure-sensitive adhesive, preferred is one of which the pressure-sensitive adhesive force lowers through irradiation with radiation (especially UV rays). When the pressure-sensitive adhesive layer of this type is used, the pressure-sensitive adhesive sheet may be readily peeled off through irradiation with UV rays after the process of grinding the back surface of a semiconductor wafer.

As the radiation-curable pressure-sensitive adhesive, for example, there may be mentioned an addition type radiation-curable pressure-sensitive adhesive prepared by adding a radiation-curable monomer or oligomer ingredient to an ordinary pressure-sensitive adhesive. The ordinary pressure-sensitive adhesive may be a pressure-sensitive adhesive such as the above-mentioned acrylic pressure-sensitive adhesive, rubber-type pressure-sensitive adhesive, etc.

Examples of the radiation-curable monomer ingredient to be added include urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy-penta (meth)acrylate, dipentaerythritol hexa(meth)acrylate, 1,4-butanediol di(meth)acrylate, etc. Examples of the radiation-curable oligomer ingredient include various urethane-type, polyether-type, polyester-type, polycarbonate-type, and polybutadiene-type oligomers, and the oligomer suitably has a molecular weight of from about 100 to about 3000. The amount of the radiation-curable monomer or oligomer ingredient to be added may be, for example, from about 5 parts by weight to about 500 parts by weight, preferably from about 40 parts by weight to about 150 parts by weight relative to 100 parts by weight of the base polymer such as the acrylic polymer constituting the pressure-sensitive adhesive.

Apart from the above-mentioned addition type radiation-curable pressure-sensitive adhesive, the radiation-curable pressure-sensitive adhesive for use herein may also be an intrinsic type radiation-curable pressure-sensitive adhesive containing, as the base polymer, a polymer having a carbon-carbon double bond in a side chain or the main chain of the polymer or at the terminal of the main chain of the polymer. The intrinsic type radiation-curable pressure-sensitive adhesive does not need to contain any low-molecule ingredient such as an oligomer ingredient or the like, or does not contain it too much, and therefore, the oligomer ingredient or the like does not move in the pressure-sensitive adhesive with time. Accordingly, the pressure-sensitive adhesive of this type is favorable since it can form a pressure-sensitive adhesive layer having a stable layer constitution.

Not specifically defined, the base polymer having a carbon-carbon double bond may be any one having a carbon-carbon double bond and having pressure-sensitive adhesiveness. As the base polymer, preferred is one having an acrylic polymer as the base skeleton. As the acrylic polymer for the base skeleton, preferred are the examples of the acrylic polymer mentioned in the above.

Not specifically defined, various methods may be employed for introducing a carbon-carbon double bond into the acrylic polymer. It is preferable to introduce a carbon-carbon double bond into the side chain of the polymer because the molecular planning is easy. For example, herein employable is a method of previously copolymerizing an acrylic polymer with a monomer having a functional group followed by reacting the resulting copolymer with a compound having a functional group capable of reacting with that functional group of the copolymer and having a carbon-carbon double bond while maintaining the radiation curability of the carbon-carbon double bond as such, through condensation or addition reaction.

Examples of the combination of functional groups include a carboxylic acid group and an epoxy group, a carboxylic acid group and an aziridyl group, a hydroxyl group and an isocyanate group, etc. Of those combinations of functional groups, preferred is a combination of a hydroxyl group and an isocyanate group as the reaction follow-up is easy. In the combination of functional groups capable of forming an acrylic polymer having a carbon-carbon double bond, the functional groups may be in either of the acrylic polymer or the compound; however, in the above-mentioned preferred combination, it is preferable that the acrylic polymer has a hydroxyl group and the compound has an isocyanate group. In this case, examples of the isocyanate compound having a carbon-carbon double bond include methacryloyl isocyanate, 2-methacryloyloxyethyl isocyanate, m-isopropenyl-$\alpha,\alpha$-dimethylbenzyl isocyanate, etc. As the acrylic polymer, usable are those copolymerized with any of the above-mentioned hydroxyl group-having monomers or ether compounds such as 2-hydroxyethyl vinyl ether, 4-hydroxybutyl vinyl ether, diethylene glycol monovinyl ether, etc.

The intrinsic type radiation-curable pressure-sensitive adhesive may contains the above-mentioned, carbon-carbon double bond-having base polymer (especially acrylic polymer) alone; however, the above-mentioned radiation-curable monomer or oligomer ingredient may be added to the pressure-sensitive adhesive in such a degree not detracting from the properties of the pressure-sensitive adhesive. The radiation-curable monomer or oligomer ingredient may be added to the pressure-sensitive adhesive generally in an amount of at most 30 parts by weight, more preferably at most 10 parts by weight relative to 100 parts by weight of the base polymer therein.

In case where the radiation-curable pressure-sensitive adhesive is cured with UV rays or the like, a photopolymerization initiator is added thereto. Examples of the photopolymerization initiator includes $\alpha$-ketol compounds such as 4-(2-hydroxyethoxy)phenyl (2-hydroxy-3-propyl) ketone, $\alpha$-hydroxy-$\alpha,\alpha'$-dimethylacetophenone, 2-methyl-2-hydroxypropiophenone, 1-hydroxycyclohexyl phenyl ketone, etc.; acetophenone compounds such as methoxyacetophenone, 2,2-dimethoxy-2-phenylacetophenone, 2,2-diethoxyacetophenone, 2-methyl-1-[4-(methylthio)-phenyl]-2-morpholinopropane-1, etc.; benzoin ether compounds such as benzoin ethyl ether, benzoin propyl ether, anisoin methyl ether, etc.; ketal compounds such as benzyldimethyl ketal, etc.; aromatic sulfonyl chloride compounds such as 2-naphthalenesulfonyl chloride, etc.; optically-active oxime compounds such as 1-phenone-1,1-propanedione-2-(o-ethoxycarbonyl)oxime, etc.; benzophenone compounds such as benzophenone, benzoylbenzoic acid, 3,3'-dimethyl-4-methoxybenzophenone, etc.; thioxanthone compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, etc.; camphorquinone; halogenoketones; acylphosphinoxides; acylphosphonates, etc. The amount of the photopolymerization initiator to be added may be, for example, from about 1 part by weight to about 10 parts by weight, preferably from about 3 parts by weight to about 5 parts by weight relative to 100 parts by weight of the base polymer such as an acrylic polymer constituting the pressure-sensitive adhesive.

As the pressure-sensitive adhesive, also usable is a heat-expandable pressure-sensitive adhesive. The heat-expandable pressure-sensitive adhesive contains the above-mentioned ordinary pressure-sensitive adhesive and heat-expandable microspheres added thereto. The heat-expandable pressure-sensitive adhesive reduces its contact area when the heat-expandable microspheres contained therein expands under heat, whereby its peeling becomes easy. Herein, the heat-expandable microspheres preferably have a mean particle size of from about 1 µm to about 25 µm, more preferably from about 5 µm to about 15 µm, even more preferably about 10 µm. Not specifically defined, the material for the heat-expandable microspheres may be any one capable of expanding under heat. For the heat-expandable microspheres, for example, usable are heat-expandable microcapsules prepared by encapsulating a vapor foaming ingredient having a low boiling point, such as butane, propane, pentane or the like, with a capsule wall of a copolymer of vinylidene chloride, acrylonitrile or the like according to an in-site polymerization method or the like. the heat-expandable microcapsules have the advantage of excellent dispersive mixability with the pressure-sensitive adhesive. Commercial products of heat-expandable microcapsules are available, such as Microsphere (manufactured by Matsumoto Yushi-Seiyaku Co., Ltd.), etc.

The amount of the heat-expandable microspheres (heat-expandable microcapsules) to be added to the pressure-sensitive adhesive may be suitably determined depending on the type of the pressure-sensitive adhesive layer, so that they may reduce the pressure-sensitive adhesive force of the pressure-sensitive adhesive layer. In general, the amount may be from about 1 part by weight to about 100 parts by weight, preferably from about 5 parts by weight to about 50 parts by weight, more preferably from about 10 parts by weight to about 40 parts by weight relative to 100 parts by weight of the base polymer.

The thickness of the pressure-sensitive adhesive layer may be suitably determined, but in relation to the other properties of the layer, the thickness may be from about 5 µm to about 300 µm, preferably from about 80 µm to about 240 µm.

The separator to be used in the substrate-less pressure-sensitive adhesive tape of the invention includes two types; a substrate separator to be a basis on which a pressure-sensitive adhesive is applied in producing the substrate-less pressure-sensitive adhesive sheet, and a pressure-sensitive adhesive surface-protective separator for protecting the pressure-sensitive adhesive surface of the substrate-less pressure-sensitive adhesive sheet. Examples of the constitutive material of these separators include paper and synthetic resins films of polyethylene, polypropylene, polyethylene terephthalate, etc. The surface of the separator may be optionally processed for lubrication through silicone treatment, long-chain alkyl treatment, fluorine treatment or the like, for enhancing the releasability thereof from pressure-sensitive adhesive layer. The thickness of the separator is preferably from 10 µm to 200 µm, more preferably from 25 µm to 100 µm. The thickness accuracy of the separator is preferably at most ±2 µm.

Sticking of the pressure-sensitive adhesive sheet of the invention to a wafer may be performed by putting the surface of the wafer on the pressure-sensitive adhesive layer of the pressure-sensitive adhesive sheet in a pressure container (for example, autoclave or the like), and then pressurizing the container to thereby sticking the pressure-sensitive adhesive sheet to the wafer. In this case, the two may be stuck to each other while pressed by a pressing means. In a vacuum chamber, the two may also be stuck to each other in the same manner as above. The sticking condition is not limited to the above, and the two may be heated in sticking them.

The working of thinning a semiconductor wafer is continued until the wafer can have a desired thickness. According to the invention, when the diameter of a wafer is represented by a (inch) and the thickness of the wafer after grinding is by b (μm), the back surface of the wafer may be ground until a value of b/a (μm/inch) becomes 27 (μm/inch). Therefore, according to the invention, a wafer can be thinned while the warpage thereof is suppressed low. Wafer warpage is often problematic in a technique of thinly grinding a wafer; however, when the pressure-sensitive adhesive sheet of the invention is used in grinding the back surface of a wafer, the value of b/a can be lowered to at most 27 (μm/inch), and therefore, even thinned wafers can be prevented from being warped.

EXAMPLES

The invention is described in detail with reference to the following Examples, to which, however, the invention is not limited.

Example 1

A mixture composition containing butyl acrylate (50 mols), ethyl acrylate (50 mols) and 2-hydroxyethyl acrylate (22 mols) was copolymerized in a toluene solution to give an acrylic copolymer having a weight-average molecular weight of 500,000. Subsequently, 2-methacryloyloxyethyl isocyanate (18 mols) was reacted with the copolymer through addition reaction to thereby introduce a carbon-carbon double bond into the side chain of the polymer molecule. Next, the polymer (100 parts by weight) was mixed with a polyisocyanate-type crosslinking agent (0.8 parts by weight) and an acetophenone-type photopolymerization initiator (3 parts by weight) to prepare an pressure-sensitive adhesive composition. The pressure-sensitive adhesive composition was applied onto a silicone-processed substrate separator (PET separator, having a thickness of 50 μm and a thickness accuracy of ±1 μm) so that the pressure-sensitive adhesive layer thus to be formed thereon could have, after dried, a thickness of 80 μm. With the coated surface thereof kept exposed out, this was irradiated with UV (UV irradiation condition: 300 mJ/cm$^2$). A silicone-processed, pressure-sensitive adhesive surface-protective separator (PET separator, having a thickness of 50 μm and a thickness accuracy of ±1 μm) was stuck to the coated surface of the pressure-sensitive adhesive layer to construct a pressure-sensitive adhesive sheet. Using a wafer taping apparatus, DR-3000II (manufactured by Nitto Seiki Co., Ltd.), the pressure-sensitive adhesive surface-protective separator was peeled off, and the pressure-sensitive adhesive sheet was stuck to the surface of an Si wafer, then the pressure-sensitive adhesive sheet was cut together with the substrate separator with a cutting blade pressed thereto, and then the substrate separator was peeled off. The back surface of the Si wafer fixed with the pressure-sensitive adhesive sheet was ground so that the thickness of the Si wafer became 50 μm, and then the wafer was checked and evaluated for the in-apparatus wafer transferability, the wafer cracking after ground, the wafer warpage after ground, the wafer TTV after ground and the pressure-sensitive adhesive sheet peelability.

Example 2

A pressure-sensitive adhesive sheet was produced in the same manner as in Example 1, for which, however, 80-μm coating was repeated twice so that the pressure-sensitive adhesive layer had a dry thickness of 160 μm. Also in the same manner as in Example 1, the pressure-sensitive adhesive sheet was stuck to a wafer and evaluated.

Example 3

A pressure-sensitive adhesive sheet was produced in the same manner as in Example 1, for which, however, 80-μm coating was repeated three times so that the pressure-sensitive adhesive layer had a dry thickness of 240 μm. Also in the same manner as in Example 1, the pressure-sensitive adhesive sheet was stuck to a wafer and evaluated.

Comparative Example 1

The pressure-sensitive adhesive composition prepared in Example 1 was applied onto a silicone-processed substrate separator (PET separator, having a thickness of 50 μm and a thickness accuracy of ±1 μm). Concretely, 80-μm coating was repeated three times so that the pressure-sensitive adhesive layer thus formed had a dry thickness of 240 μm. A silicone-processed, pressure-sensitive adhesive surface-protective separator (PET separator, having a thickness of 50 μm and a thickness accuracy of ±1 μm) was stuck to the coated surface of the pressure-sensitive adhesive layer to construct a pressure-sensitive adhesive sheet. In the same manner as in Example 1, the pressure-sensitive adhesive sheet was stuck to a wafer and evaluated.

Comparative Example 2

The pressure-sensitive adhesive composition prepared in Example 1 was applied onto a substrate (EVA film, having a thickness of 115 μm, a thickness accuracy of ±3 μm and an initial elastic modulus of 70 MPa) so that the pressure-sensitive adhesive layer thus to be formed thereon had, after dried, a thickness of 30 μm. With the coated surface thereof kept exposed out, this was irradiated with UV (UV irradiation condition: 300 mJ/cm$^2$). A silicone-processed, pressure-sensitive adhesive surface-protective separator (PET separator, having a thickness of 50 μm and a thickness accuracy of ±1 μm) was stuck to the coated surface of the pressure-sensitive adhesive layer to construct a pressure-sensitive adhesive sheet. Using a wafer taping apparatus, DR-3000II (manufactured by Nitto Seiki Co., Ltd.), the pressure-sensitive adhesive face-protective separator was peeled off, and the pressure-sensitive adhesive sheet was stuck to the surface of an Si wafer, then the pressure-sensitive adhesive sheet was cut together with the substrate separator with a cutting blade pressed thereto. The back surface of the Si wafer fixed with the pressure-sensitive adhesive sheet was ground so that the thickness of the Si wafer became 50 μm, and then the wafer was checked and evaluated for the in-apparatus wafer transferability, the wafer cracking after ground, the wafer warpage after ground, the wafer TTV after ground and the pressure-sensitive adhesive sheet peelability.

Comparative Example 3

A pressure-sensitive adhesive sheet was produced in the same manner as in Comparative Example 2, for which, however, a polyethylene film (having a thickness of 150 μm, a thickness accuracy of ±2 µm and an initial elastic modulus of 130 MPa) was used as the substrate. In the same manner as in Comparative Example 2, the pressure-sensitive adhesive sheet was stuck to a wafer and evaluated.

Comparative Example 4

A pressure-sensitive adhesive sheet was produced in the same manner as in Comparative Example 2, for which, however, a PET film (having a thickness of 50 µm, a thickness accuracy of ±1 µm and an initial elastic modulus of 3 GPa) was used as the substrate and the thickness of the pressure-sensitive adhesive layer after dried was 22 µm. Also in the same manner as in Comparative Example 2, the pressure-sensitive adhesive sheet was stuck to a wafer and evaluated.

Each of the pressure-sensitive adhesive sheets produced in Examples and Comparative Examples was stuck to an 8-inch Si wafer and checked and evaluated for the in-apparatus wafer transferability, the wafer cracking after ground, the wafer warpage after ground, the wafer TTV after ground and the pressure-sensitive adhesive sheet peelability in the manner mentioned below.

In-Apparatus Wafer Transferability

In a Disco's back grinder "DFG-8560", the Si wafer was worked and checked as to whether or not it could be transferred in the apparatus with the back surface of the pressure-sensitive adhesive sheet stuck thereto kept not sticking to the robot arm.

Wafer Cracking After Ground

In a Disco's back grinder "DFG-8560", the Si wafer was ground until the thickness of the Si wafer became 50 µm, and the wafer was checked as to whether or not it could be ground without crack.

Wafer Warpage After Ground

After ground, the warpage of the Si wafer was determined as follows. One minute after the grinding, the Si wafer with the pressure-sensitive adhesive sheet kept stuck thereto was put on a flat place and the swelling height (mm) at the edge thereof was measured.

Wafer TTV After Ground

Using HAMAMATSU MAPPING STAGE C8126 (manufactured by Hamamatsu Photonics), the ground Si wafer with the pressure-sensitive adhesive sheet kept stuck thereto was analyzed to determine the total thickness variation TTV (µm), the difference between the uppermost limit and the lowermost limit of the in-plane thickness of the Si wafer.

Pressure-Sensitive Adhesive Sheet Peelability

Using HR-8500II (manufactured by Nitto Seiki Co., Ltd.), the sample was checked as to whether or not the pressure-sensitive adhesive sheet could be peeled off from the background Si wafer.

The properties of the pressure-sensitive adhesive sheet were determined according to the methods mentioned below.

Method for Determination of Pressure-Sensitive Adhesive force

A 20-mm wide pressure-sensitive adhesive sheet is stuck to an Si wafer at 23° C., and then peeled at an angle of 180° and at a speed of 300 mm/min. The pressure-sensitive adhesive force taken in the peeling is read.

Back Surface Pressure-Sensitive Adhesive Force

This is the pressure-sensitive adhesive force of the surface of the pressure-sensitive adhesive sheet opposite to the surface thereof stuck to the front surface of an Si wafer.

Pre-UV Pressure-Sensitive Adhesive Force

This is the pressure-sensitive adhesive force of the surface of the pressure-sensitive adhesive sheet stuck to the front surface of an Si wafer.

Post-UV Pressure-Sensitive Adhesive Force

The pressure-sensitive adhesive sheet is stuck to the front surface of an Si wafer, and then irradiated with UV (UV irradiation condition, 300 mJ/cm$^2$). The pressure-sensitive adhesive force after UV irradiation is the post-UV pressure-sensitive adhesive force.

Back Surface Ball Tack Test

According to JIS Z0237, the pressure-sensitive adhesive sheet is tested with a ball No. 6 at an inclination angle of 20°.

Initial Elastic Modulus

In this description, the initial elastic modulus is as follows: A strip-like pressure-sensitive adhesive sheet having a width of 10 mm is pulled at 23° C. between chucks spaced by 50 mm from each other, at a speed of 300 mm/min, and on the S-S curve of the tested sample, the initial elastic modulus is determined.

Thickness Accuracy

For the thickness accuracy of the separator and the substrate, the thickness of each sample is measured at intervals of 10 mm in the cross direction using a 1/1000 dial gauge.

The results of Examples 1 to 3 and Comparative Examples 1 to 4 are shown in Table 1 and Table 2.

TABLE 1

| | Substrate | Thickness of Substrate (µm) | Thickness of Pressure-Sensitive Adhesive Layer (µm) | Back Ball Tack No. 6 (inclination 20°) | Back Surface Pressure-Sensitive Adhesive force (N/20 mm) | Pre-UV Pressure-Sensitive Adhesive force (N/20 mm) | Post-UV Pressure-Sensitive Adhesive force (N/20 mm) |
|---|---|---|---|---|---|---|---|
| Example 1 | None | 0 | 80 | Not stopped | 0.2 | 1.3 | 0.2 |
| Example 2 | None | 0 | 160 | Not stopped | 0.1 | 1.5 | 0.2 |
| Example 3 | None | 0 | 240 | Not stopped | 0.1 | 1.5 | 0.3 |
| Comparative Example 1 | None | 0 | 240 | Stopped | 1.5 | 1.5 | 0.3 |
| Comparative Example 2 | EVA | 115 | 30 | — | — | 2.8 | 0.2 |
| Comparative Example 3 | PO | 150 | 30 | — | — | 3.2 | 0.2 |
| Comparative Example 4 | PET | 50 | 22 | — | — | 9.5 | 0.1 |

TABLE 2

| | Initial Elastic Modulus (MPa) | In-Apparatus Transferability | Wafer Warpage after Ground (mm) | Wafer Cracking after Ground | Wafer TTV after Ground (μm) | Pressure-Sensitive Adhesive Sheet Peelability after Ground |
|---|---|---|---|---|---|---|
| Example 1 | 35 | Possible | 4 | No | 1.7 | Possible |
| Example 2 | 35 | Possible | 5 | No | 2.0 | Possible |
| Example 3 | 35 | Possible | 5 | No | 2.2 | Possible |
| Comparative Example 1 | 0.15 | Impossible | Impossible to grind | Impossible to grind | Impossible to grind | Impossible to grind |
| Comparative Example 2 | 70 | Possible | 30 | No | 6.0 | Possible |
| Comparative Example 3 | 130 | Possible | 40 | No | 5.5 | Possible |
| Comparative Example 4 | 3000 | Possible | 5 | Cracked | 2.8 | Possible |

As shown in Table 1 and Table 2, in Examples 1 to 3 where the substrate-less pressure-sensitive adhesive sheet was used, the ball did not stop in the back ball tack test, and the back surface pressure-sensitive adhesive force was low, and therefore, the in-apparatus transferability of the wafer was good. Further, in these examples, since the initial elastic modulus of the pressure-sensitive adhesive sheet was low, the wafer warpage after ground was extremely small, the wafer did not crack after ground, and the wafer TTV after ground was extremely small. On the other hand, in Comparative Example 1, since the back surface of the pressure-sensitive adhesive sheet was not processed for pressure-sensitive adhesiveness removal, the back surface of the pressure-sensitive adhesive sheet stuck to the robot arm in the apparatus, and the back surface of the wafer could not be ground. In Comparative Examples 2 and 3, since an EVA film or a PO film having a high initial elastic modulus was used as the substrate, the wafer warpage after ground and the wafer TTV after ground were both extremely large. In Comparative Example 4, since the substrate PET was a rigid film, the pressure in grinding the back surface of the wafer could not be dispersed, and the wafer cracked after the grinding thereof.

While the present invention has been described in detail and with reference to specific embodiments thereof, it will be apparent to one skilled in the art that various changes and modifications can be made therein without departing from the scope thereof.

This application is based on Japanese patent application No. 2009-057644 filed Mar. 11, 2009, the entire contents thereof being hereby incorporated by reference.

What is claimed is:

1. A method for grinding a back surface of a semiconductor wafer, the method comprising sticking a substrate-less pressure-sensitive adhesive sheet to a front surface of the semiconductor wafer while a separator is kept laminated on the surface of said pressure-sensitive adhesive sheet opposite to the surface thereof to be stuck to the front surface of the semiconductor wafer; cutting said pressure-sensitive adhesive sheet along with the separator; peeling the separator alone; and then grinding the back surface of the semiconductor wafer, wherein said substrate-less pressure-sensitive adhesive sheet consists of a pressure-sensitive adhesive layer, wherein the pressure-sensitive adhesive layer is formed of a UV-curable pressure-sensitive adhesive comprising a polymer composed mainly of an acrylic monomer polymerizable compound, wherein the pressure-sensitive adhesive force of a surface of the pressure-sensitive adhesive layer to be stuck to the front surface of the semiconductor wafer is larger than the pressure-sensitive adhesive force of the opposite surface thereof, and said pressure-sensitive adhesive layer having an initial elastic modulus of from 0.01 MPa to 500 MPa.

\* \* \* \* \*